United States Patent
Hu et al.

(10) Patent No.: US 10,163,678 B2
(45) Date of Patent: Dec. 25, 2018

(54) SINKER WITH A REDUCED WIDTH

(71) Applicant: Texas Instruments Incorporated, Dallas, TX (US)

(72) Inventors: Binghua Hu, Plano, TX (US); Sameer Pendharkar, Allen, TX (US); Guru Mathur, Plano, TX (US); Takehito Tamura, Ichikawa (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 66 days.

(21) Appl. No.: 14/682,823

(22) Filed: Apr. 9, 2015

(65) Prior Publication Data

US 2015/0214096 A1 Jul. 30, 2015

Related U.S. Application Data

(62) Division of application No. 13/540,542, filed on Jul. 2, 2012, now Pat. No. 9,293,357.

(51) Int. Cl.
*H01L 21/762* (2006.01)
*H01L 29/06* (2006.01)
(Continued)

(52) U.S. Cl.
CPC .. *H01L 21/76224* (2013.01); *H01L 21/02109* (2013.01); *H01L 21/265* (2013.01);
(Continued)

(58) Field of Classification Search
None
See application file for complete search history.

(56) References Cited

U.S. PATENT DOCUMENTS 6,218,722 B1 * 4/2001 Cervin-Lawry .... H01L 23/5252
257/50
6,514,810 B1 * 2/2003 Kim .................. H01L 21/82380
257/E21.633

(Continued)

FOREIGN PATENT DOCUMENTS

KR 10 2010 0118153 A 11/2010

OTHER PUBLICATIONS

U.S. Appl. No. 13/288,199, filed Nov. 3, 2011 to Seetharaman Sridhar et al.

*Primary Examiner* — Matthew Reames
*Assistant Examiner* — Steven B Gauthier
(74) *Attorney, Agent, or Firm* — Jacqueline J. Garner; Charles A. Brill; Frank D. Cimino

(57) ABSTRACT

Forming a semiconductor structure by forming a plurality of trenches in a semiconductor material, forming a plurality of non-conductive structures in the plurality of trenches, and forming a doped region of the first conductivity type. The plurality of trenches are spaced apart from each other, have substantially equal depths, and include a first trench and a second trench. The plurality of non-conductive structures include a first non-conductive structure in the first trench and a second non-conductive structure in the second trench. The doped region is formed between the first non-conductive structure and the second non-conductive structure. No region of a second conductivity type lies horizontally in between the first non-conductive structure and the second non-conductive structure.

15 Claims, 8 Drawing Sheets

(51) Int. Cl.
  *H01L 21/02* (2006.01)
  *H01L 21/265* (2006.01)
  *H01L 21/283* (2006.01)
  *H01L 21/3205* (2006.01)

(52) U.S. Cl.
  CPC ...... *H01L 21/283* (2013.01); *H01L 21/32055* (2013.01); *H01L 21/76232* (2013.01); *H01L 29/0619* (2013.01)

(56) References Cited

U.S. PATENT DOCUMENTS

| | | |
|---|---|---|
| 6,657,262 B2 | 12/2003 | Patti |
| 6,943,426 B2 | 9/2005 | Williams et al. |
| 7,956,391 B2 | 6/2011 | Disney et al. |
| 8,089,129 B2 | 1/2012 | Disney et al. |
| 2001/0050412 A1* | 12/2001 | Patti ............... H01L 27/0705 257/565 |
| 2003/0214011 A1 | 11/2003 | Jianjun et al. |
| 2004/0032005 A1 | 2/2004 | Williams et al. |
| 2008/0203424 A1 | 8/2008 | Chen et al. |
| 2008/0251846 A1 | 10/2008 | Voldman |
| 2009/0127630 A1 | 5/2009 | Balster et al. |
| 2009/0294841 A1 | 12/2009 | Pendharkar et al. |
| 2010/0207238 A1 | 8/2010 | Tilke et al. |
| 2010/0320537 A1 | 12/2010 | Park et al. |
| 2011/0204423 A1 | 8/2011 | Tameto |
| 2011/0275168 A1 | 11/2011 | Davis et al. |
| 2012/0043608 A1 | 2/2012 | Yang et al. |
| 2012/0139013 A1 | 6/2012 | Bahl et al. |
| 2013/0105904 A1 | 5/2013 | Roybal et al. |
| 2013/0153916 A1 | 6/2013 | Weyers et al. |
| 2013/0168762 A1 | 7/2013 | Darwish |
| 2013/0320487 A1* | 12/2013 | Mauder ............... H01L 29/861 257/509 |

* cited by examiner

SINKER WITH A REDUCED WIDTH

1. CROSS REFERENCE TO RELATED APPLICATIONS

This application is a divisional of U.S. Nonprovisional patent application Ser. No. 13/540,542, filed Jul. 2, 2012, the contents of which are herein incorporated by reference in its entirety.

2. FIELD OF THE INVENTION

The present invention relates to sinkers and, more particularly, to a sinker with a reduced width.

3. DESCRIPTION OF THE RELATED ART

A sinker is a heavily-doped region, such as an n+ region, that extends from the top surface of a semiconductor body, such as an epitaxial layer, down a substantial distance into the semiconductor body. A sinker can be used, for example, to provide a low resistance current path, such as the collector sinker of a bipolar transistor. Sinkers can also be used to provide lateral isolation for devices that are formed in the semiconductor body.

FIG. 1 shows a cross-sectional view that illustrates a prior-art semiconductor structure 100. As shown in FIG. 1, semiconductor structure 100 includes an epitaxial layer 110, and a sinker 112 that extends down into epitaxial layer 110. Sinker 112 has a depth X of approximately 5-10 μm, an n conductivity type, a peak dopant concentration greater than $1 \times 10^{19}$ atoms/cm$^3$, and a sheet resistance less than approximately 5-10 ohms/square.

Conventionally, sinkers, such as sinker 112, are fabricated by first forming a patterned hard mask on the semiconductor body, such as epitaxial layer 110. The patterned hard mask has an opening that extends through the hard mask. A dopant, such as an n-type dopant, is then implanted through the opening into the semiconductor body. The implanted dopant has a width Y that is defined by the width of the opening in the hard mask. For example, the width Y can be approximately 1 μm. Following this, the implanted dopant is driven in to form the sinker.

One problem with the conventional formation of sinkers is that, following the drive in, the resulting sinkers are quite large and consume a significant amount of silicon real estate. Although the width Y of the dopant may be approximately 1 μm following the implant, the sinker expands in size to have a width Z that is much larger than the width Y as a result of diffusion from the drive in. For example, the width Z can be greater than 10 μm.

Sinkers with large widths limit the number of laterally-adjacent devices that can be formed in the semiconductor body. As a result, there is a need to reduce the widths of the sinkers.

SUMMARY OF THE INVENTION

The semiconductor structure of the present invention provides a sinker with a reduced width. A semiconductor structure of the present invention includes a semiconductor body that has a top surface, a first doped region that touches the top surface, a second doped region that touches the first doped region, and a plurality of trenches that each extend from the top surface down into the semiconductor body. The first doped region has a first conductivity type. The plurality of trenches are spaced apart from each other, have substantially equal depths, and include a first trench and a second trench.

The semiconductor structure also has a plurality of isolation structures that lie in the plurality of trenches. The plurality of isolation structures are spaced apart and include a first isolation structure and a second isolation structure. The first isolation structure has a non-conductive surface that touches the semiconductor body exposed by the first trench. The second isolation structure has a non-conductive surface that touches the semiconductor body exposed by the second trench. The first doped region lies in between and touches the first isolation structure and the second isolation structure. No region of a second conductivity type lies horizontally in between the first isolation structure and the second isolation structure.

The semiconductor structure of the present invention can alternately include a semiconductor body that has a top surface, a first doped region that touches the top surface, a second doped region that touches the first doped region. The first doped region has a dopant concentration substantially greater than a dopant concentration of the second doped region.

In addition, the semiconductor structure of the present invention can alternately include a plurality of trench isolation structures that each extend from the top surface down into the semiconductor body. The plurality of trench isolation structures are apart from each other, have substantially equal depths, and include a first trench isolation structure and a second trench isolation structure. The first doped region includes a horizontal portion that touches the top surface of the semiconductor body and extends continuously from the first isolation structure to the second isolation structure. The horizontal portion has a substantially uniform dopant concentration.

A method of forming a semiconductor structure in the present invention includes forming a plurality of trenches in a semiconductor body. The plurality of trenches are spaced apart from each other, have substantially equal depths, and include a first trench and a second trench. The method also includes forming a plurality of non-conductive structures to lie in the plurality of trenches. The plurality of non-conductive structures are spaced apart and include a first non-conductive structure that lies in the first trench and a second non-conductive structure that lies in the second trench.

The method further includes forming a doped region to lie in between and touch the first non-conductive structure and the second non-conductive structure. The doped region has a first conductivity type. No region of a second conductivity type lies horizontally in between the first non-conductive structure and the second non-conductive structure.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 2:
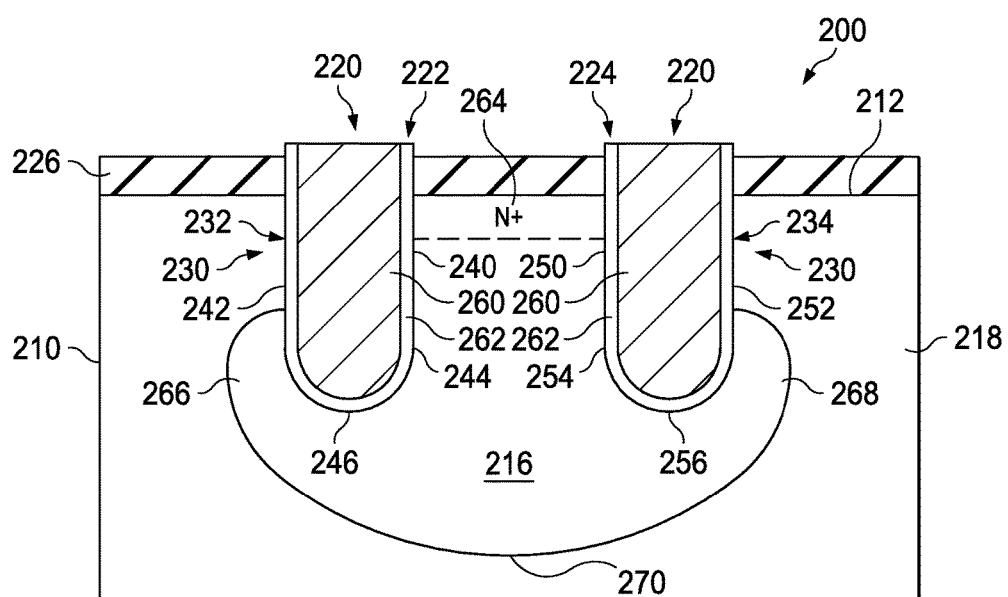
FIG. 2 is a cross-sectional view illustrating an example of a semiconductor structure 200 in accordance with the present invention.

FIG. 2 shows a cross-sectional view that illustrates an example of a semiconductor structure 200 in accordance with the present invention. As described in greater detail below, semiconductor structure 200 utilizes a number of trench isolation structures to reduce the widths of the sinkers.

As shown in FIG. 2, semiconductor structure 200 includes a semiconductor body 210 that has a top surface 212, a bottom surface 214, a first doped region 216 that touches top surface 212, and a second doped region 218 that touches first doped region 216. Semiconductor body 210 can be implemented with, for example, single-crystal silicon such as epitaxial silicon and wafer silicon.

In addition, first doped region 216 has a first conductivity type (e.g., n type) and a dopant concentration that is substantially greater than the dopant concentration of second doped region 218. For example, first doped region 216 can include a heavy dopant concentration (e.g., $>1\times10^{19}$ atoms/cm$^3$), while second doped region 218 can have a much lighter dopant concentration (e.g., $<1\times10^{14}$ atoms/cm$^3$).

Semiconductor body 210 also has a number of spaced-apart trench openings 220 that extend from the top surface 212 of semiconductor body 210 down into semiconductor body 210. The trench openings 220, which have substantially equal depths, include a first trench opening 222 and a second trench opening 224. In the present example, the depth of each trench opening 220 is each approximately 2.5 µm.

As further shown in FIG. 2, semiconductor structure 200 also includes a non-conductive structure 226 that touches top surface 212, and a number of spaced-apart isolation structures 230 that lie within the trench openings 220. The isolation structures 230, which have substantially equal lengths, include a first isolation structure 232 and a second isolation structure 234. As a result, first isolation structure 232 extends down a first distance from the top surface 212 into semiconductor body 210, second isolation structure 234 extends down a second distance from the top surface 212 into semiconductor body 210, and the first and second distances are substantially equal.

In addition, first isolation structure 232 has a non-conductive outer surface 240 that touches the portion of semiconductor body 210 exposed by first trench opening 222. Further, non-conductive outer surface 240 has an interior side wall surface 242, an exterior side wall surface 244, and a bottom surface 246 that connects together interior side wall surface 242 and exterior side wall surface 244.

Similarly, second isolation structure 234 has a non-conductive outer surface 250 that touches the portion of semiconductor body 210 exposed by second trench opening 224. Non-conductive outer surface 250 has an interior side wall surface 252, an exterior side wall surface 254, and a bottom surface 256 that connects together interior side wall surface 252 and exterior side wall surface 254. Further, as shown in FIG. 2, a portion of the exterior side wall surface 244 faces a portion of the exterior side wall surface 254.

In the present example, first isolation structure 232 and second isolation structure 234 are each implemented with a polysilicon core 260 and a non-conductive outer structure 262 that touches the side wall surface and the bottom surface of polysilicon core 260 to electrically isolate second doped region 218 from polysilicon core 260.

Further in the present example, polysilicon core 260 is doped to have an n conductivity type, and non-conductive outer structure 262 is implemented with oxide. Alternately, first isolation structure 232 and second isolation structure 234 can each be implemented with only a non-conductive material such as oxide.

As additionally shown in FIG. 2, first doped region 216 lies horizontally in between and touches first isolation structure 232 and second isolation structure 234. Further, no region of a second conductivity type (e.g., p type) lies horizontally in between any portion of first isolation structure 232 and second isolation structure 234.

In addition, first doped region 216 has a horizontal portion 264 that touches the top surface 212 of semiconductor body 210 and extends continuously from the exterior side wall surface 244 of first isolation structure 232 to the exterior side wall surface 254 of second isolation structure 234. The horizontal portion 264 has a heavy dopant concentration (e.g., $>1\times10^{19}$ atoms/cm$^3$) and a substantially uniform dopant concentration.

Further, a first portion 266 of first doped region 216 extends around the bottom surface 246 and partially up the interior side wall surface 242 of first isolation structure 232. In addition, a second portion 268 of first doped region 216 extends around the bottom surface 256 and partially up the interior side wall surface 252 of second isolation structure 234.

As a result, a first portion of second doped region 218 touches the interior side wall surface 242 of first isolation structure 232 vertically in between the top surface 212 and the first portion 266 of first doped region 216. Further, a second portion of second doped region 218 touches the interior side wall surface 252 of second isolation structure 234 vertically in between the top surface 212 and the second portion 268 of first doped region 216. In addition, in the present example, a bottom surface 270 of first doped region 216 is vertically spaced apart from the bottom surface 214 of semiconductor body 210.

Figure 3A:
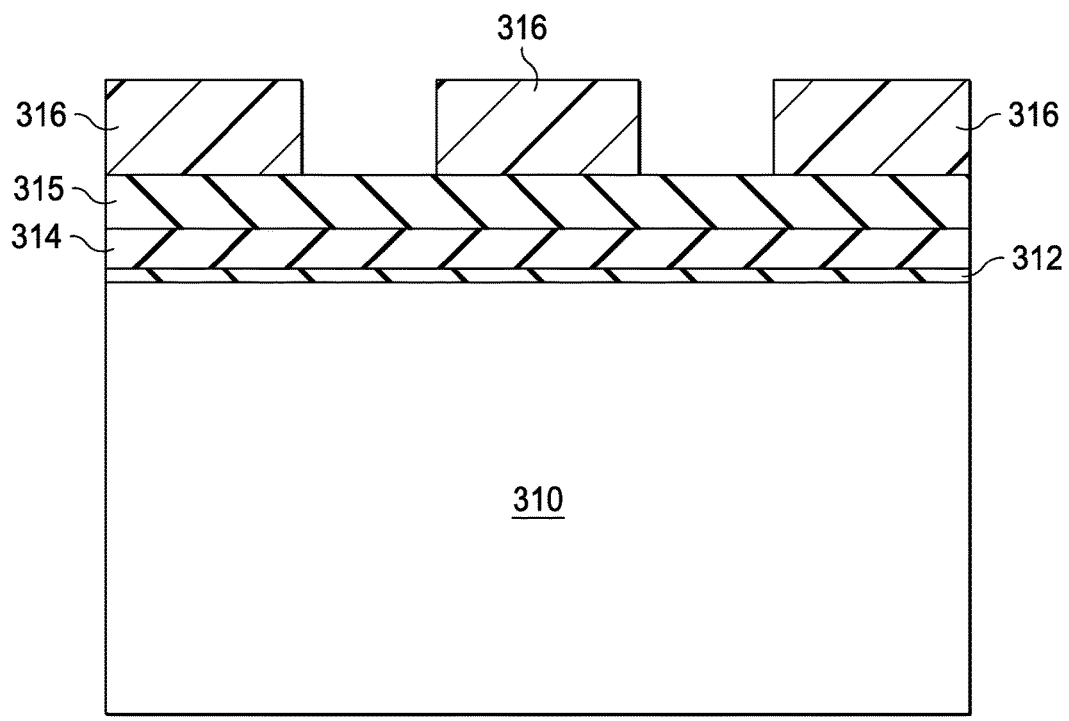
FIGS. 3A-3K are cross-sectional views illustrating an example of a method 300 of forming a semiconductor structure in accordance with the present invention.

FIGS. 3A-3K show cross-sectional views that illustrate an example of a method 300 of forming a semiconductor structure in accordance with the present invention. As shown in FIG. 3A, method 300 utilizes a conventionally-formed semiconductor body 310. Semiconductor body 310, in turn, can be implemented with, for example, single-crystal silicon such as epitaxial silicon and wafer silicon.

As additionally shown in FIG. 3A, method 300 begins by depositing an oxide layer 312 on semiconductor body 310, followed by the deposition of a nitride layer 314 on oxide layer 312 and the deposition of an oxide layer 315 on nitride layer 314. Oxide layer 312, nitride layer 314, and oxide layer 315 can each have a range of thicknesses. In the present example, oxide layer 312 has a thickness of approximately 150 Å, nitride layer 314 has a thickness of approximately 2000 Å, and oxide layer 315 has a thickness of approximately 3000 Å. Further, oxide layer 312 can be implemented with thermally grown oxide, while oxide layer 315 can be implemented with any kind of deposited silicon dioxide (SiO$_2$) layer.

Next, a patterned photoresist layer 316 approximately 1 µm thick is formed on the top surface of oxide layer 315. Patterned photoresist layer 316 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

Figure 3B:
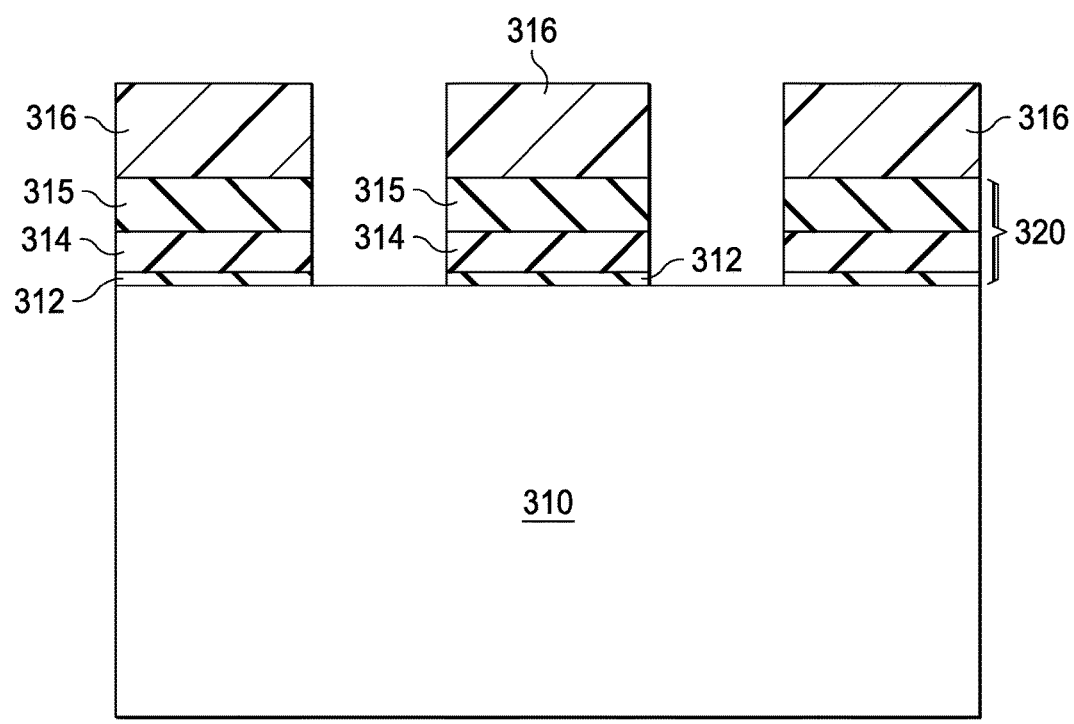

As shown in FIG. 3B, after patterned photoresist layer 316 has been formed, the exposed regions of oxide layer 315 and the underlying regions of nitride layer 314 and oxide layer 312 are etched to form a hard mask 320 that has a number of openings that extend completely through hard mask 320. After hard mask 320 has been formed, patterned photoresist layer 316 is removed in a conventional manner.

Figure 3C:
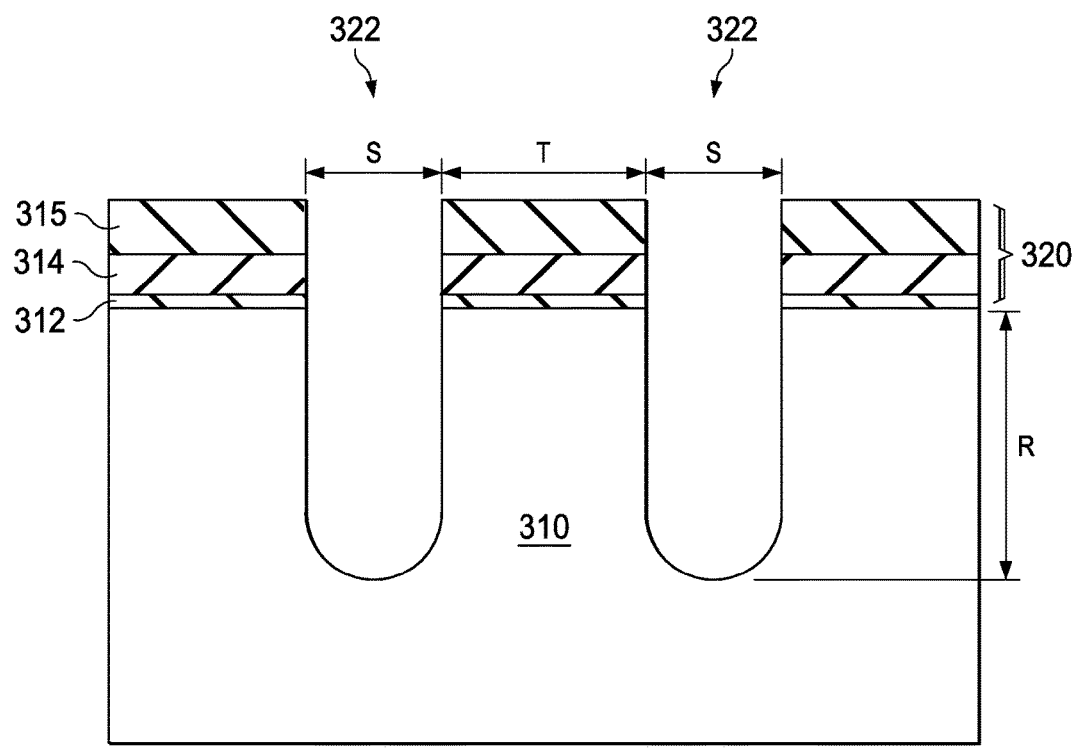

As shown in FIG. 3C, following the removal of patterned photoresist layer 316, semiconductor body 310 is etched through the openings in hard mask 320 to form a number of trench openings 322. The trench openings 322 can have a range of depths, widths, and spaces between laterally-adjacent openings 322. In the present example, the trench openings 322 have a depth R of 2.5 μm, a width S of 0.7 μm, and a space T between laterally-adjacent openings 322 of 0.5 μm. The trench openings 322 have side walls which can also have a range of side wall angles, where a 90° side wall angle is substantially perpendicular to the top surface of semiconductor body 310. In the present example, the trench openings 322 have side wall angles of 88°.

Figure 3D:
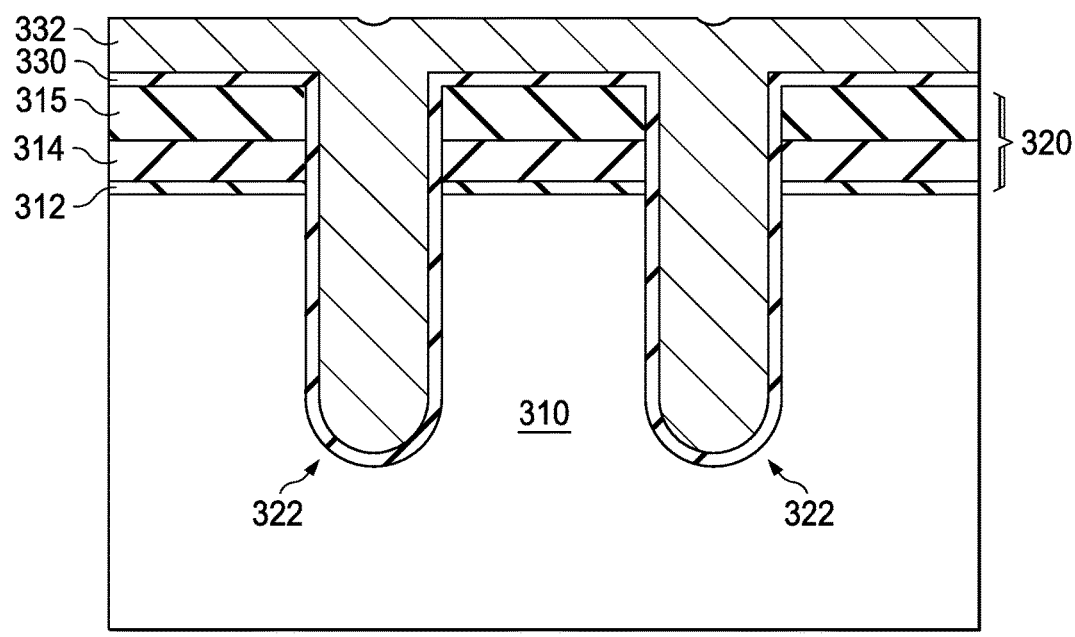

As shown in FIG. 3D, after the trench openings 322 have been formed, a non-conductive liner 330 is conformally deposited on hard mask 320 and the exposed regions of semiconductor body 310 to line the trench openings 322. For example, liner 330 can be formed by thermally growing oxide to a depth of approximately 200 Å, followed by the deposition of an oxide layer to a depth of approximately 2000 Å using sub-atmospheric pressure chemical vapor deposition (SACVD).

Next, after non-conductive liner 330 has been formed, a conductive layer 332 is deposited on non-conductive liner 330 to fill the remainder of the trench openings 322. In the present example, conductive layer 332 is formed by conventionally depositing a polysilicon layer on non-conductive liner 330 to fill the remainder of the trench openings 322. The polysilicon layer can be in-situ doped or implanted with a dopant after deposition in a conventional manner. In the present example, the polysilicon layer is doped to have an n conductivity type.

Figure 3E:
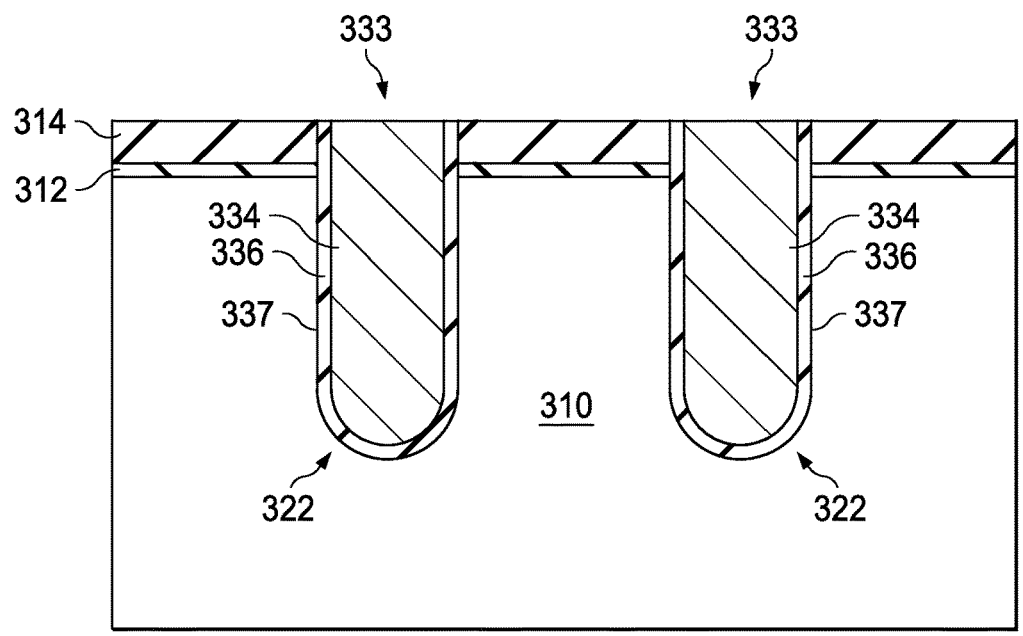

Following this, as shown in FIG. 3E, conductive layer 332, non-conductive liner 330, and oxide layer 315 are planarized in a conventional manner, such as with an etch back or chemical-mechanical polishing. The planarization continues until oxide layer 315 has been removed from the top surface of nitride layer 314 to form a number of trench isolation structures 333 that fill the trench openings 322.

Thus, in the present example, the trench isolation structures 333 have a polysilicon core 334 and a non-conductive outer structure 336. Non-conductive outer structure 336, in turn, has a non-conductive outer surface 337 that touches the semiconductor body 310 exposed by the trench openings 322.

Alternately, rather than implementing the trench isolation structures 333 with polysilicon core 334 and non-conductive outer structure 336, the trench isolation structures 333 can be implemented with only a non-conductive material. In this case, rather than lining the trench openings 322 with a non-conductive material, the trench openings 322 are filled with the non-conductive material.

Figure 3F:
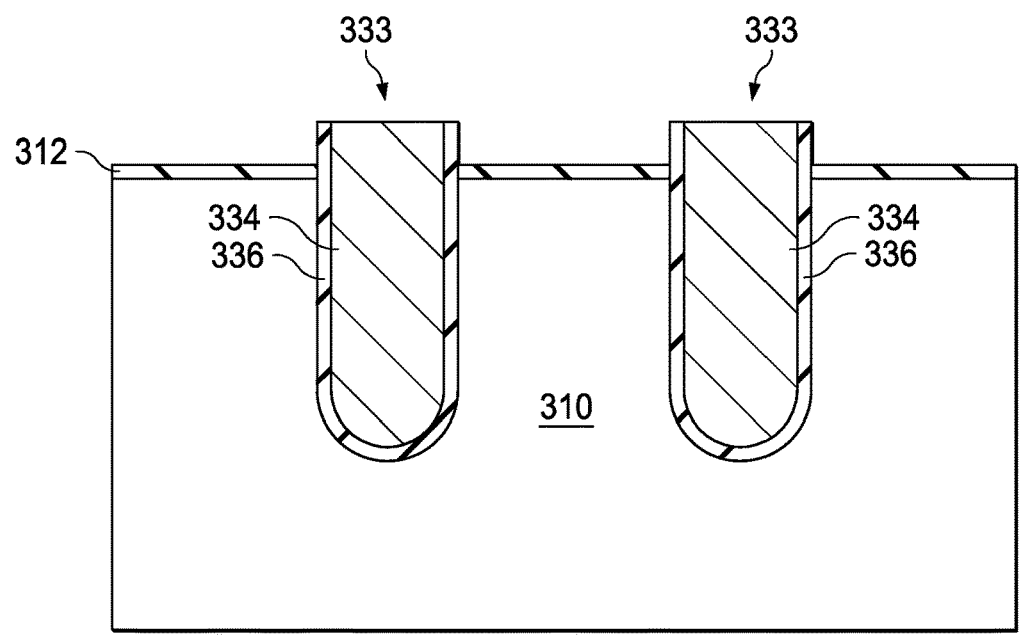
Figure 3G:
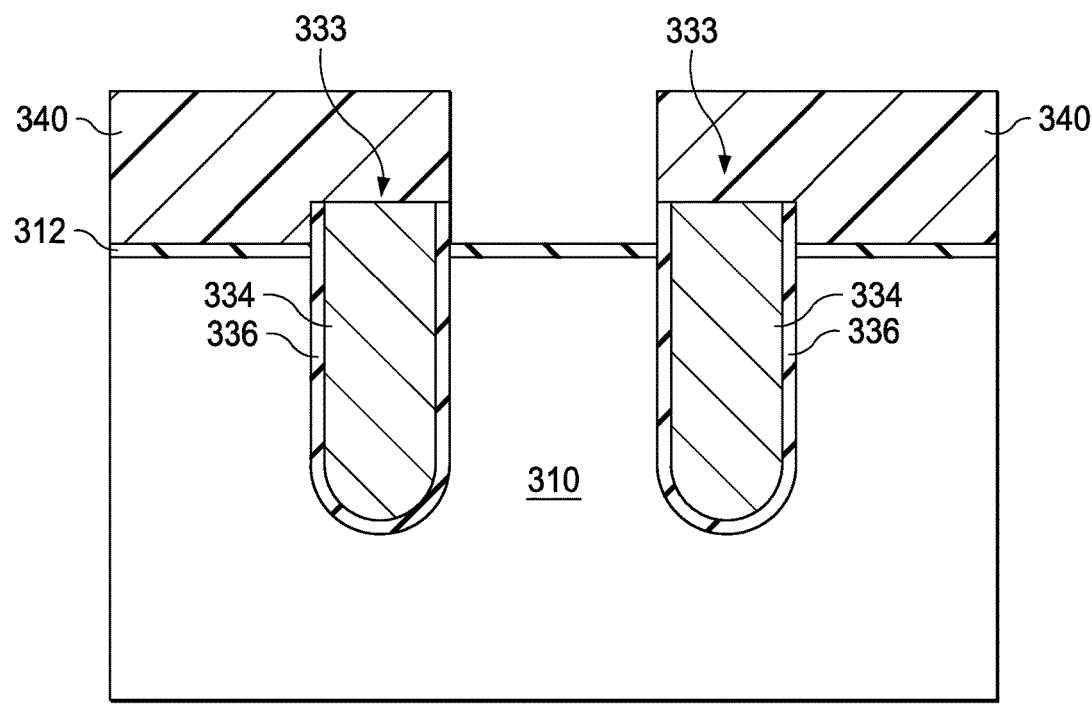

As shown in FIG. 3F, after the trench isolation structures 333 have been formed, nitride layer 314 is removed using conventional procedures. Following this, as shown in FIG. 3G, a patterned photoresist layer 340 is formed on the top surface of oxide layer 312 and the trench isolation structures 333 in a conventional manner.

Once patterned photoresist layer 340 has been formed, a dopant is implanted into semiconductor body 310 between a horizontally-adjacent pair of trench isolation structures 333. In the present example, the implant has a dopant concentration that is greater than $1 \times 10^{19}/cm^3$. After the implant, patterned photoresist layer 340 is removed in a conventional manner.

Figure 3H:
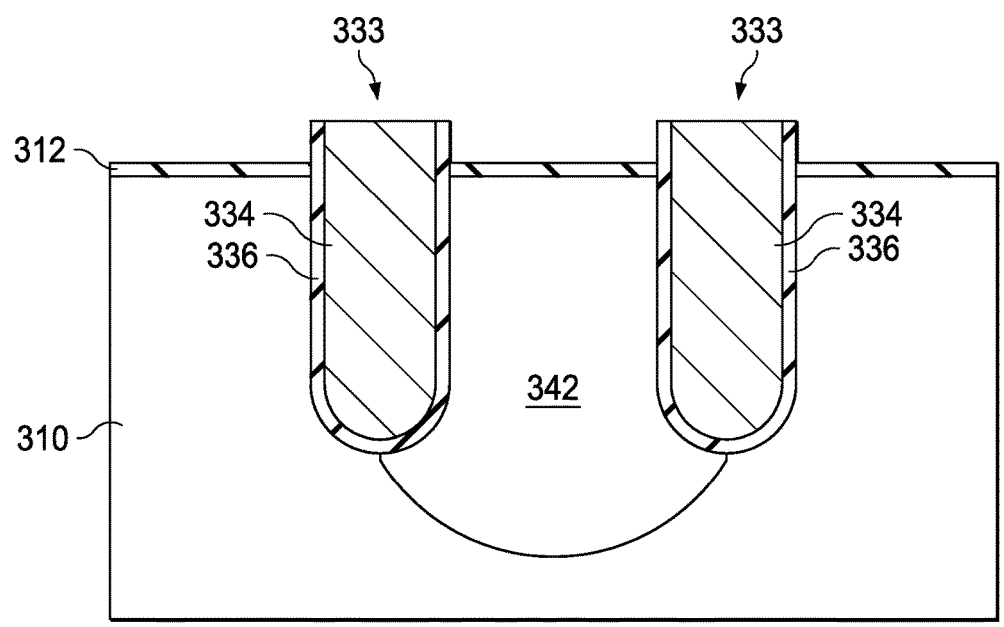

Following this, as shown in FIG. 3H, semiconductor body 310 is conventionally annealed at 1150° C. to drive in the implant and form a sinker 342. When polysilicon is used to implement conductive layer 332, the polysilicon can withstand the 1150° C. anneal without detrimental stress effects.

Figure 3I:
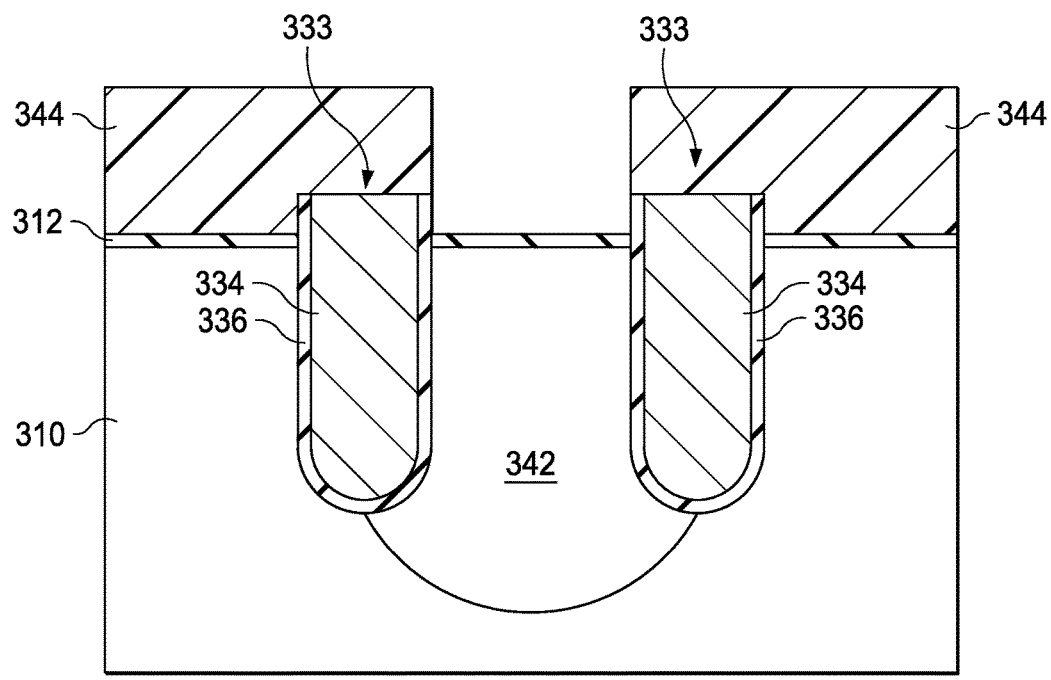

As shown in FIG. 3I, after sinker 342 has been formed, a patterned photoresist layer 344 is formed on the top surface of oxide layer 312 and the trench isolation structures 333 in a conventional manner. Once patterned photoresist layer 344 has been formed, a dopant is implanted into semiconductor body 310 to form a number of well structures for other devices and, at the same time, further dope sinker 342. After the implant, patterned photoresist layer 344 is removed in a conventional manner.

Figure 3J:
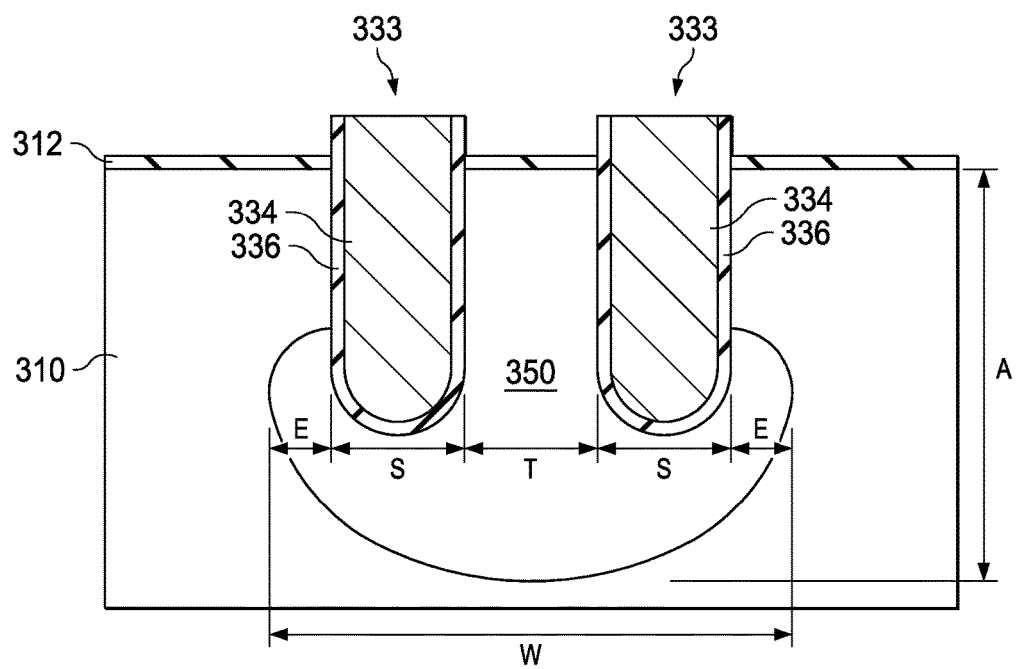

Following this, as shown in FIG. 3J, semiconductor body 310 is conventionally annealed at 1100° C. to drive in the implant and form a sinker 350 from sinker 342. In the present example, sinker 350 has a depth A of approximately 6 μm or more, an n conductivity type, a peak dopant concentration greater than $1 \times 10^{19}$ atoms/cm$^3$, and a sheet resistance approximately 4.5 ohms/square.

As further shown in FIG. 3J, the additional anneal allows sinker 350 to extend up the opposite sides of the trench isolation structures 333 and horizontally further outward by a distance E. In the present example, the distance E is approximately 1.5 μm. Sinker 342 can be utilized (without the additional implant and anneal required to form sinker 350) when the sinker is used only for lateral isolation.

Figure 3K:
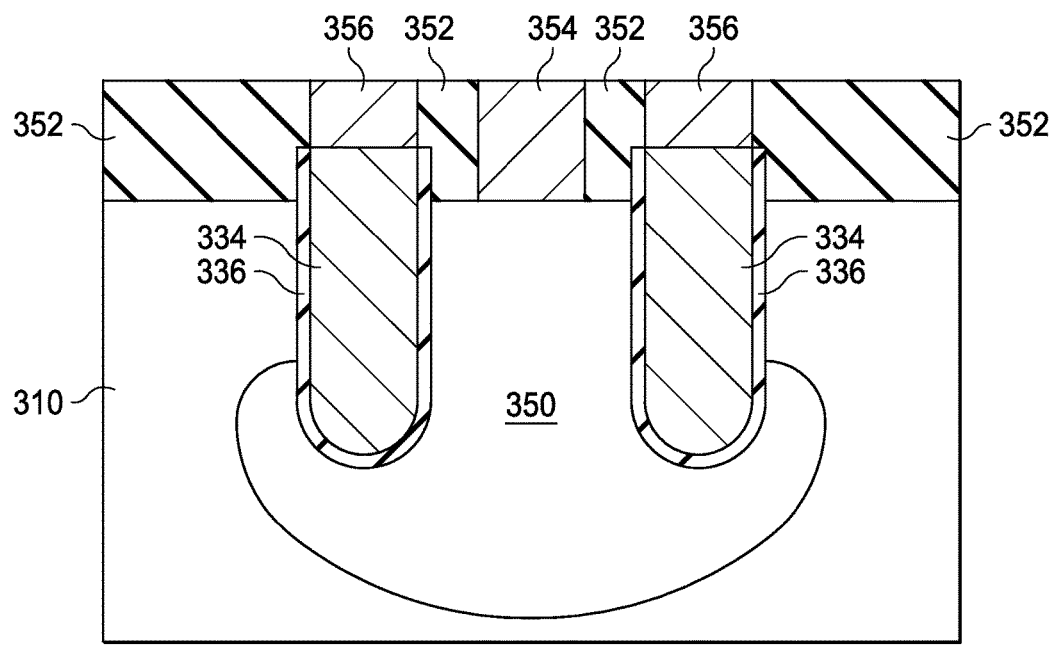

After sinker 350 has been formed, the method follows conventional steps which, as shown in FIG. 3K, include the formation of a non-conductive layer 352 on the top surface of semiconductor body 310 and the trench isolation structures 333, the formation of spaced-apart openings in non-conductive layer 352 that expose polysilicon core 334 and sinker 350, the formation of a metallic contact 354 that makes an electrical connection with sinker 350, and the formation of metallic contacts 356 that make electrical connections with polysilicon core 334. The metallic contacts 356 to polysilicon core 334 can be optionally omitted.

Figure 1:
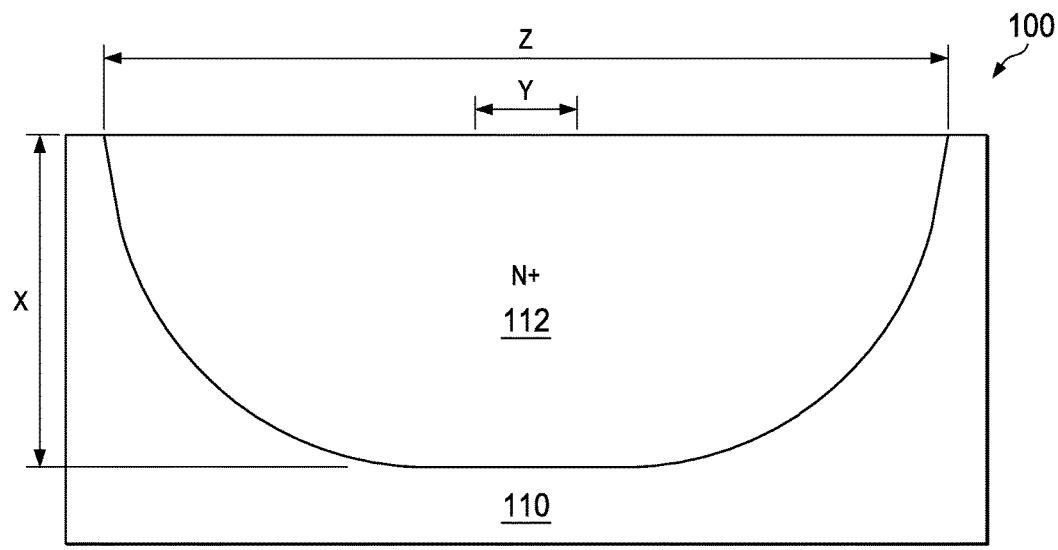
FIG. 1 is a cross-sectional view illustrating a prior-art semiconductor structure 100.

One of the advantages of sinker 350 is that sinker 350 has a width W that is substantially less than the width Y of sinker 112 shown in prior art FIG. 1. In the present example, width W is the sum of 2E+2S+T which, in the present example, is approximately 5 μm. This is approximately one-half the width Z of sinker 112 shown in prior art FIG. 1. In addition, even larger reductions in the widths of the sinkers can be obtained for higher voltage devices. As a result, the width of sinker 350 is independent of the required vertical depth.

Another advantage of the present invention is that limiting the lateral diffusion, which contains most of sinker 350 between the trench isolation structures 333, reduces the sheet resistance. Thus, by forming sinker 350 after the trench isolation structures 333 have been formed, which is essential to the present invention, the trench isolation structures 333 significantly limit the final widths of sinker 350.

Figure 4:
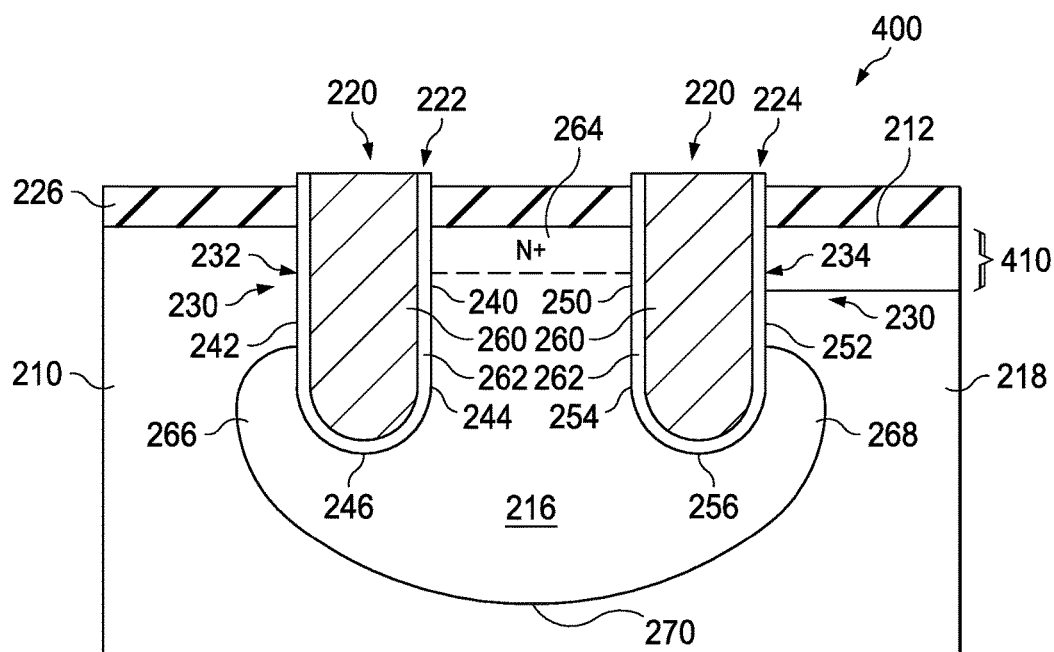
FIG. 4 is a cross-sectional view illustrating an example of a semiconductor structure 400 in accordance with an alternate embodiment of the present invention.

FIG. 4 shows a cross-sectional view that illustrates an example of a semiconductor structure 400 in accordance with an alternate embodiment of the present invention. Semiconductor structure 400 is similar to semiconductor structure 200 and, as a result, utilizes the same reference numerals to designate the elements that are common to both structures.

As shown in FIG. 4, semiconductor structure 400 differs from semiconductor structure 200 in that semiconductor structure 400 includes a well 410 that touches the interior side wall surface 242 of first isolation structure 232. In the present example, well 410 has an n conductivity type, and a dopant concentration that is greater than the dopant concentration of second doped region 218, but less than the dopant concentration of first doped region 216.

As a result, the first portion of second doped region 218 touches the interior side wall surface 242 of first isolation structure 232 vertically in between the bottom surface of well 410 and the first portion 266 of first doped region 216. Well 410 can be formed, for example, at the same time that an n-type drain extension region of a DMOS transistor is formed. In the present example, well 410 is formed by modifying patterned photoresist layer 344 to expose the region of semiconductor body 310 where well 410 is to be formed. Further, a metal interconnect structure, which includes a metallic contact like metallic contact 354, can be used to electrically connect doped region 216 to well 410 to mitigate surface change issues.

Figure 5:
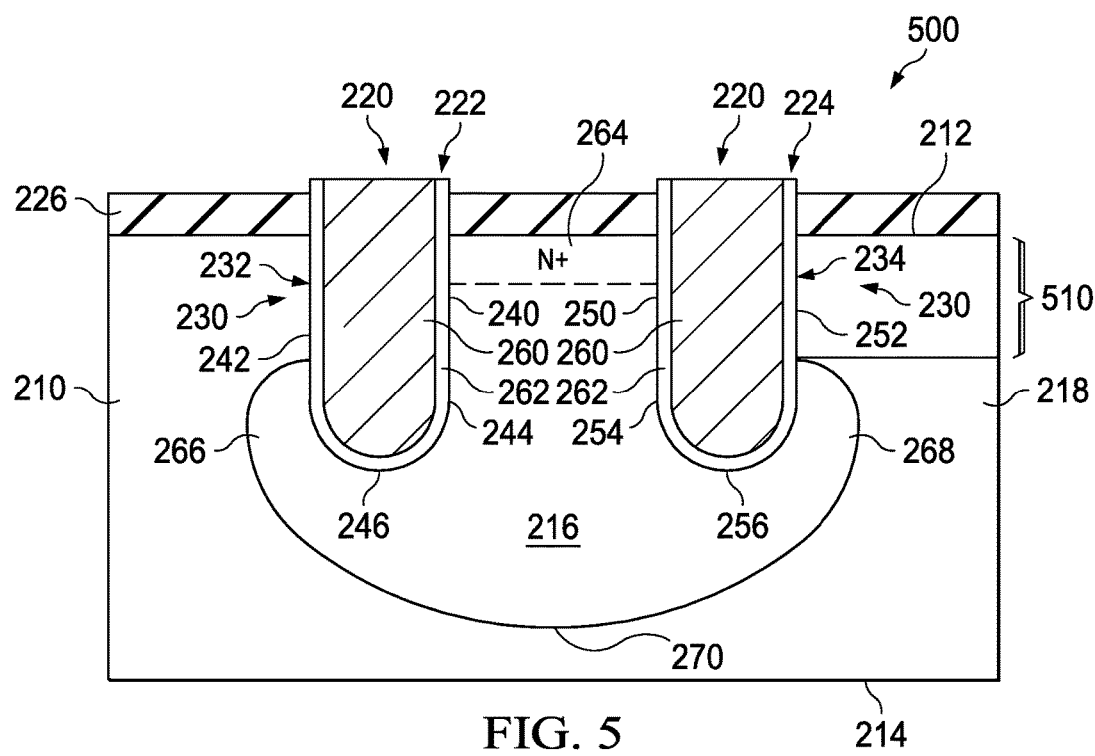
FIG. 5 is a cross-sectional view illustrating an example of a semiconductor structure 500 in accordance with an alternate embodiment of the present invention.

FIG. 5 shows a cross-sectional view that illustrates an example of a semiconductor structure 500 in accordance with an alternate embodiment of the present invention. Semiconductor structure 500 is similar to semiconductor structure 400 and, as a result, utilizes the same reference numerals to designate the elements that are common to both structures.

As shown in FIG. 5, semiconductor structure 500 differs from semiconductor structure 400 in that semiconductor structure 500 utilizes a well 510 in lieu of well 410. Well 510, in turn, differs from well 410 in that well 510 is deeper than well 410, extending down to touch doped region 216. In the present example, well 510 touches the interior side wall surface 242 of first isolation structure 232.

In addition, well 510 has an n conductivity type, and a dopant concentration that is greater than the dopant concentration of second doped region 218, but less than the dopant concentration of first doped region 216. Well 510 can be formed, for example, at the same time that the n-type wells for other devices are formed. In the present example, well 510 is formed by modifying patterned photoresist layer 344 to expose the region of semiconductor body 310 where well 510 is to be formed.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor structure comprising:
   forming a plurality of trenches in a semiconductor material, the plurality of trenches being spaced apart from each other, having substantially equal depths, and including a first trench and a second trench;
   forming a plurality of non-conductive structures in the plurality of trenches, the plurality of non-conductive structures being spaced apart and including a first non-conductive structure in the first trench and a second non-conductive structure in the second trench; and
   after forming the plurality of trenches, forming a doped region in between and touching the first non-conductive structure and the second non-conductive structure using first and second implant steps and first and second anneals, the doped region having a first conductivity type, no region of a second conductivity type lying horizontally in between the first non-conductive structure and the second non-conductive structure; and
   forming a horizontal portion of the doped region that touches the top surface of the semiconductor material, extends to a depth less than a depth of the first and second isolation structures, and extends continuously from the first non-conductive structure to the second non-conductive structure, the horizontal portion having a substantially uniform dopant concentration.

2. The method of claim 1 wherein:
   the first non-conductive structure includes a first interior side wall surface, a first exterior side wall surface, and a first bottom surface that connects the first interior side wall surface to the first exterior side wall surface; and
   the second non-conductive structure includes a second interior side wall surface, a second exterior side wall surface, and a second bottom surface that connects the second interior side wall surface to the second exterior side wall surface.

3. The method of claim 2 wherein the doped region touches the first exterior side wall surface and extends continuously from the first exterior side wall surface to touch the second exterior side wall surface.

4. The method of claim 3 wherein:
   a portion of the doped region extends around the first bottom surface and partially up the first interior side wall surface to lie vertically spaced apart from a top surface of the semiconductor material; and
   a portion of the doped region extends around the second bottom surface and partially up the second interior side wall surface to lie vertically spaced apart from a top surface of the semiconductor material.

5. The method of claim 4 and further comprising forming a well of the first conductivity type that touches the first interior side wall surface and a top surface of the semiconductor material.

6. The method of claim 4 wherein the first non-conductive structure includes a polysilicon core and a non-conductive outer structure that touches a side wall surface and a bottom surface of the polysilicon core.

7. The method of claim 4 and further comprising:
   forming a non-conductive layer that touches a top surface of the semiconductor material; and
   forming a metallic contact that extends through the non-conductive layer to make an electrical connection with the doped region.

8. A method of forming a semiconductor structure comprising:
   forming a plurality of trenches in a semiconductor material, the plurality of trenches being spaced apart from each other and including a first trench and a second trench;

forming a plurality of isolation structures in the plurality of trenches, the plurality of isolation structures being spaced apart and including a first isolation structure in the first trench and a second isolation structure in the second trench; and forming a sinker by:

performing a first implant to implant a dopant into the semiconductor material between the first and second isolation structures;

annealing the dopant of the first implant to form a doped region in the semiconductor material;

performing a second implant to implant further dopant into the doped region; and annealing the doped region after performing the second implant to extend the doped region under the first and second trenches and up an opposite side of the first trench and the second trench, the doped region having a first conductivity type, no region of a second conductivity type lying horizontally in between the first isolation structure and the second isolation structure.

9. The method of claim 8 wherein:

the first isolation structure includes a first interior side wall surface, a first exterior side wall surface, and a first bottom surface that connects the first interior side wall surface to the first exterior side wall surface; and the second isolation structure includes a second interior side wall surface, a second exterior side wall surface, and a second bottom surface that connects the second interior side wall surface to the second exterior side wall surface.

10. The method of claim 9, wherein the doped region touches the first exterior side wall surface and extends continuously from the first exterior side wall surface to touch the second exterior side wall surface.

11. The method of claim 10, wherein:

a portion of the doped region extends around the first bottom surface and partially up the first interior side wall surface to lie vertically spaced apart from a top surface of the semiconductor material; and a portion of the doped region extends around the second bottom surface and partially up the second interior side wall surface to lie vertically spaced apart from a top surface of the semiconductor material.

12. The method of claim 11, and further comprising forming a well of the first conductivity type that touches the first interior side wall surface and a top surface of the semiconductor material.

13. The method of claim 11, wherein the first isolation structure includes a polysilicon core and a non-conductive outer structure that touches a side wall surface and a bottom surface of the polysilicon core.

14. The method of claim 11, and further comprising:

forming a non-conductive layer that touches a top surface of the semiconductor material; and forming a metallic contact that extends through the non-conductive layer to make an electrical connection with the doped region.

15. The method of claim 8, wherein forming the sinker includes forming a horizontal portion of the doped region that touches the top surface of the semiconductor material, extends to a depth less than a depth of the first and second isolation structures, and extends continuously from the first isolation structure to the second isolation structure, the horizontal portion having a substantially uniform dopant concentration.

* * * * *